United States Patent
Kim

(10) Patent No.: US 9,236,870 B2
(45) Date of Patent: Jan. 12, 2016

(54) INTEGRATED CIRCUITS AND METHODS FOR DYNAMIC FREQUENCY SCALING

(71) Applicant: Samsung Electronics Co., Ltd., Suwon-Si, Gyeonggi-Do (KR)

(72) Inventor: Tae-hyung Kim, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 103 days.

(21) Appl. No.: 14/082,308

(22) Filed: Nov. 18, 2013

(65) Prior Publication Data
US 2014/0204697 A1    Jul. 24, 2014

(30) Foreign Application Priority Data
Jan. 18, 2013   (KR) .................. 10-2013-0006066

(51) Int. Cl.
| | | |
|---|---|---|
| G11C 8/18 | (2006.01) | |
| H03L 7/081 | (2006.01) | |
| G11C 7/10 | (2006.01) | |
| G11C 7/22 | (2006.01) | |
| G11C 11/406 | (2006.01) | |

(52) U.S. Cl.
CPC ............ *H03L 7/0812* (2013.01); *G11C 7/1066* (2013.01); *G11C 7/222* (2013.01); *G11C 11/40611* (2013.01)

(58) Field of Classification Search
CPC .... H01L 7/0812; G11C 7/1066; G11C 7/222; G11C 11/40611
USPC ............................ 365/233.12, 233.11, 233.13
See application file for complete search history.

(56) References Cited

U.S. PATENT DOCUMENTS

| | | | |
|---|---|---|---|
| 6,066,968 A | 5/2000 | Yang | |
| 6,392,456 B1 * | 5/2002 | Pyeon et al. | 327/156 |
| 6,452,432 B2 | 9/2002 | Kim | |
| 6,707,758 B2 * | 3/2004 | Kono | 365/189.15 |
| 6,853,225 B2 | 2/2005 | Lee | |
| 6,954,094 B2 | 10/2005 | Lee et al. | |
| 7,024,324 B2 * | 4/2006 | Rifani et al. | 702/79 |
| 7,199,625 B1 * | 4/2007 | Chung | 327/149 |
| 7,202,719 B2 * | 4/2007 | Gabato et al. | 327/158 |
| 7,254,729 B2 * | 8/2007 | Matsushima et al. | 713/322 |
| 7,430,676 B2 | 9/2008 | Baker et al. | |
| 7,609,799 B2 * | 10/2009 | Li | 375/376 |
| 7,616,036 B1 * | 11/2009 | Tabatabaei | 327/158 |
| 7,710,171 B2 * | 5/2010 | Kim et al. | 327/158 |

(Continued)

FOREIGN PATENT DOCUMENTS

| | | |
|---|---|---|
| KR | 0598101 | 10/2005 |
| KR | 0815187 | 3/2008 |

*Primary Examiner* — Viet Q Nguyen
(74) *Attorney, Agent, or Firm* — Harness, Dickey & Pierce, P.L.C.

(57) ABSTRACT

In an integrated circuit, a first delay locked loop circuit is configured to adjust a phase of a first clock signal input to a first clock input terminal, and to at least one of transmit and receive information based on the phase-adjusted first clock signal. A second delay locked loop circuit is configured to adjust a phase of a second clock signal input to a second clock input terminal, and to at least one of transmit and receive information based on the phase-adjusted second clock signal. A path selection circuit is configured to select, in response to a select signal, one of a first signal path through the first delay locked loop circuit and a second signal path through the second delay locked loop circuit as a signal path for at least one of transmitting and receiving the information.

10 Claims, 8 Drawing Sheets

(56) References Cited

U.S. PATENT DOCUMENTS

| | | | |
|---|---|---|---|
| 7,751,519 B2 * | 7/2010 | Farbarik et al. | 375/371 |
| 8,009,490 B2 * | 8/2011 | Chae | 365/193 |
| 8,095,761 B1 | 1/2012 | Schulze et al. | |
| 8,253,455 B2 | 8/2012 | Hyun et al. | |
| 9,001,612 B2 * | 4/2015 | Jung | 365/233.1 |
| 2012/0126868 A1 | 5/2012 | Machnicki et al. | |
| 2014/0375329 A1 * | 12/2014 | Van De Graaff et al. | 324/511 |

* cited by examiner

INTEGRATED CIRCUITS AND METHODS FOR DYNAMIC FREQUENCY SCALING

CROSS-REFERENCE TO RELATED APPLICATIONS

This application claims priority under 35 U.S.C. §119 to Korean Patent Application No. 10-2013-0006066, filed on Jan. 18, 2013, in the Korean Intellectual Property Office, the disclosure of which is incorporated herein in its entirety by reference.

BACKGROUND

1. Field

Example embodiments of inventive concept relate to memory systems and/or methods of controlling operations thereof, and more particularly, to integrated circuits and/or methods for dynamic frequency scaling.

2. Description of Conventional Art

A synchronous memory system, such as synchronous DRAM (SDRAM), operates in synchronization with a clock signal applied from the outside, or operates an internal circuit at a timing of a predetermined phase relationship with respect to a phase of a clock signal. In the synchronous memory system, a delay locked loop (DLL) circuit is required to remove the influence of a propagation delay of a clock signal. Therefore, a synchronous memory system using such a DLL circuit requires a technique to change the operating frequency of a clock signal quickly and reliably.

SUMMARY

Example embodiments provide methods for dynamic frequency scaling, which change a clock frequency faster and more stably in memory systems by using a dual delay locked loop (DLL) circuit module.

Example embodiments also provide integrated circuits configured to change a clock frequency faster and more stably in memory systems by using a dual DLL circuit module.

According to an example embodiment, there is provided a method for dynamic frequency scaling in a memory system including a dual delay locked loop (DLL) circuit module, the method including: adjusting a phase of a second clock signal by supplying the second clock signal to one DLL circuit block in a standby state, which is not connected to a signal path for information transmission between a memory controller and a memory device, of two DLL circuit blocks in the dual DLL circuit module; and after the DLL circuit block in a standby state reaches a lock state, changing the signal path to allow a signal path, which is connected to a DLL circuit block to which a first clock signal is supplied in the dual DLL circuit module, to connect to the DLL circuit block in a standby state during a period where no information is transmitted between the memory controller and the memory device.

The first clock signal may be a clock signal currently in use in the memory system, and the second clock signal may be a clock signal to be used next (e.g., after the first clock signal) in the memory system.

The period where no information is transmitted between the memory controller and the memory device may include an auto refresh operation period of the memory device.

The signal path may include at least one of a data signal path or a control signal path.

The adjusting of the phase of the second clock signal may include: generating the second clock signal according to a clock frequency change request; supplying the second clock signal to the DLL circuit block in a standby state; and adjusting the phase of the second clock signal in the DLL circuit block in a standby state.

The adjusting of the phase of the second clock signal may include: receiving the second clock signal having a frequency corresponding to the clock frequency change request; supplying the second clock signal to the DLL circuit block in a standby state; and adjusting the phase of the second clock signal in the DLL circuit block in a standby state.

The DLL circuit block connected to the signal path may adjust a phase of an inputted clock signal and may transmit or receive a data signal or a control signal via the signal path on the basis of the phase-adjusted clock signal.

The method may further include, after the signal path is changed to the DLL circuit block in a standby state, stopping the generating of the first clock signal.

Another example embodiment provides a method for dynamic frequency scaling in a memory system, the method comprising: adjusting a phase of a first clock signal by supplying the first clock signal to a first delay locked loop circuit in a standby state; and changing, after the first delay locked loop circuit in the standby state reaches a lock state, a signal path for transmitting information between a memory controller and a memory device from a second signal path through a second delay locked loop circuit to which a second clock signal is supplied to a first signal path through the first delay locked loop circuit in the standby state during a period in which no information is transmitted between the memory controller and the memory device.

The second clock signal may be a clock signal currently in use by the memory system, and the first clock signal may be a clock signal to be used by the memory system after the second clock signal. The period in which no information is transmitted between the memory controller and the memory device may include an auto refresh operation period of the memory device.

The signal path may include at least one of a data signal path and a control signal path.

The adjusting of the phase of the first clock signal may include: generating the first clock signal in response to a clock frequency change request; supplying the first clock signal to the first delay locked loop circuit in the standby state; and adjusting, by the first delay locked loop circuit in the standby state, the phase of the first clock signal.

Alternatively, the adjusting of the phase of the first clock signal may include: receiving the first clock signal having a frequency corresponding to a clock frequency change request; supplying the first clock signal to the first delay locked loop circuit in the standby state; and adjusting, by the first delay locked loop circuit in the standby state, the phase of the first clock signal.

The method may further include: at least one of transmitting and receiving a data signal or a control signal via the first signal path based on the phase-adjusted first clock signal. The second clock signal may be stopped after changing the signal path to first signal path through the first delay locked loop circuit in the standby state.

According to another example embodiment, there is provided an integrated circuit including: a first delay locked loop (DLL) circuit block adjusting a phase of a first clock signal inputted to a first clock input terminal, and transmitting or receiving information on the basis of the phase-adjusted first clock signal; a second DLL circuit block adjusting a phase of a second clock signal inputted to a second clock input terminal, and transmitting or receiving information on the basis of the phase-adjusted second clock signal; and a path selection circuit block connecting a signal path, which transmits or receives the information, to one of the first DLL circuit block or the second DLL circuit block in response to a select signal, wherein the select signal may be generated during a period where no information is transmitted between a memory controller and a memory device.

A period where no information is transmitted between the memory controller and the memory device may include an auto refresh operation period of the memory device.

The path selection circuit block may include: a demultiplexer selectively connecting a signal path inputting the information to an information input terminal of the first DLL circuit or an information input terminal of the second DLL circuit, in response to a first select signal; and a multiplexer selectively connecting an information output terminal of the first DLL circuit or an information output terminal of the second DLL circuit to a signal path outputting the information, in response to a second select signal.

A clock signal of a frequency currently in use may be inputted to one, which is connected to a signal path transmitting or receiving the information, of the first DLL circuit block and the second DLL circuit block; and a clock signal of a frequency to be used next may be inputted to the other one, which is not connected to a signal path transmitting or receiving the information.

Each of the first DLL circuit block and the second DLL circuit block may include: a DLL circuit adjusting a phase of a clock signal inputted to a clock input terminal; and a buffer circuit latching information inputted to an information input terminal connected to the signal path on the basis of the phase-adjusted clock signal in the DLL circuit to output the latched information to an information output terminal connected to the signal path.

The integrated circuit may further include a processor generating a clock frequency change request, wherein a clock signal to be used next is applied to a clock input terminal of the first DLL circuit block or the second DLL circuit clock, which is not connected to the signal path, according to the clock frequency change request.

The integrated circuit may be disposed in one of the memory controller and the memory device.

Another example embodiment provides an integrated circuit including: a first delay locked loop circuit configured to adjust a phase of a first clock signal input to a first clock input terminal, and to at least one of transmit and receive information based on the phase-adjusted first clock signal; a second delay locked loop circuit configured to adjust a phase of a second clock signal input to a second clock input terminal, and to at least one of transmit and receive information based on the phase-adjusted second clock signal; and a path selection circuit configured to select, in response to a select signal, one of a first signal path through the first delay locked loop circuit and a second signal path through the second delay locked loop circuit as a signal path for at least one of transmitting and receiving the information; wherein the select signal is generated during a period in which information is not transmitted between a memory controller and a memory device.

The period during which information is not transmitted between the memory controller and the memory device may include an auto refresh operation period of the memory device.

The path selection circuit may include: a demultiplexer configured to input the information to an information input terminal of the first delay locked loop circuit or an information input terminal of the second delay locked loop circuit in response to a first select signal; and a multiplexer configured to output the information from an information output terminal of the first delay locked loop circuit or an information output terminal of the second delay locked loop circuit in response to a second select signal.

The second delay locked loop circuit may be in a standby state, the first clock signal may be a clock signal currently in use by the memory system, and the second clock signal may be a clock signal to be used by the memory system after the first clock signal.

The first delay locked loop circuit may include: a delay locked loop circuit configured to adjust the phase of the first clock signal input to the first clock input terminal; and a buffer circuit configured to latch the information input to an information input terminal based on the phase-adjusted first clock signal, and to output the latched information to an information output terminal.

The integrated circuit may further include: a processor configured to generate a clock frequency change request; wherein when the path selection circuit selects the first signal path, the second clock signal may be applied to the second clock input terminal of the second delay locked loop circuit according to the clock frequency change request.

Another example embodiment provides an integrated circuit including: a first delay locked loop circuit configured to adjust a phase of a first clock signal, and output first information based on input information and the phase-adjusted first clock signal; a second delay locked loop circuit configured to adjust a phase of a second clock signal while in a standby state, the second DLL circuit being further configured to output second information based on the input information and the phase-adjusted second clock signal; and a path selection circuit configured to switch from a first signal path to a second signal path for the input information in response to a select signal, the first signal path including the first delay locked loop, and the second signal path including the second delay locked loop.

The path selection circuit may be configured to switch from the first signal path to the second signal path during a period where no information is transmitted between a memory controller and a memory device.

The period where no information is transmitted between the memory controller and the memory device may include an auto refresh operation period of the memory device.

The path selection circuit may include: a demultiplexer configured to input the input information to the first delay locked loop circuit or the second delay locked loop circuit based on a first select signal; and a multiplexer configured to output the first information or the second information based on a second select signal.

The second delay locked loop circuit may be configured to adjust the phase of the second clock signal prior to receiving the input information.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
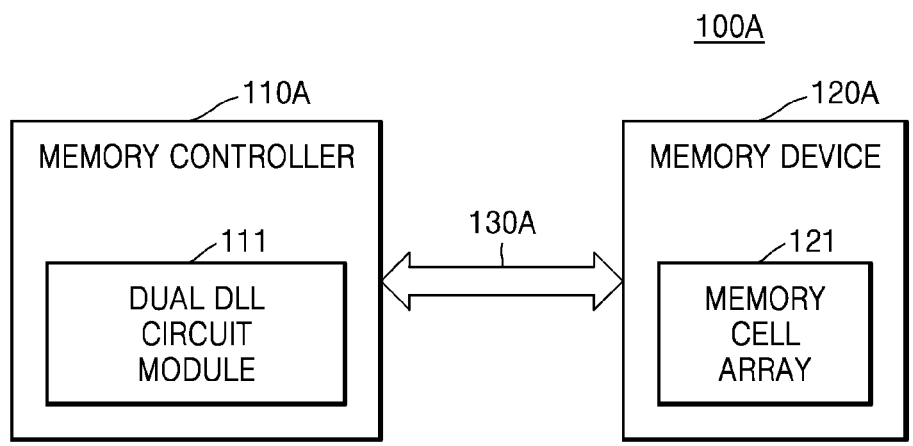
FIG. 1 is a block diagram illustrating a memory system according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms used herein include technical terms and scientific terms, and also have the same meanings that those of ordinary skill in the art commonly understand. Additionally, it should be understood that typically used terms defined in dictionaries have consistent meanings in related technical contents, and if not explicitly defined, should not be interpreted as being excessive formal meanings.

FIG. 1 is a block diagram illustrating a memory system 100A according to an example embodiment.

As shown in FIG. 1, the memory system 100A includes a memory controller 110A, a memory device 120A, and a system bus 130A.

The memory controller 110A generates various signals to control a dual delay locked loop (DLL) circuit module 111 and the memory device 120A. For example, the memory controller 110A generates a clock signal, an address signal, and a control signal. For example, the memory controller 110A may generate a clock signal currently in use and the next clock signal to be used through different signal paths. For example, control signals may include write enable signals, chip select signals, row address strobe signals, and column address strobe signals. Moreover, the memory controller 110A provides data signals to the memory device 120A or receives data signals from the memory device 120A in communication with the memory device 120A.

Also, the memory controller 110A may generate signals necessary for controlling operations of the dual DLL circuit module 111 and the memory device 120A at the timings shown in FIGS. 11(a) to 11(g).

The memory controller 110A includes the dual DLL circuit module 111. For example, the dual DLL circuit module 111 may be included in an analog PHY (i.e., a physical layer) of the memory controller 110A.

The dual DLL circuit module 111 includes two DLL circuit blocks. The dual DLL circuit module 111 generates a phase-adjusted clock signal by using one DLL circuit block selected from among the two DLL circuit blocks and performs a fetch operation on an address signal and a control signal on the basis of the phase-adjusted clock signal so as to transmit them to the memory device 120A. Additionally, the dual DLL circuit module 111 performs a data signal fetch operation on the basis of the phase-adjusted clock signal, so as to transmit data to the memory device 120A or receive data from the memory device 120A.

The dual DLL circuit module 111 supplies a second clock signal to one not currently in use among the two DLL circuit blocks in the dual DLL circuit module 111 so as to adjust the phase of the second clock signal. The second clock signal may be supplied to a DLL circuit block in a standby state, which is not connected to a signal path for information transmission between the memory controller 110A and the memory device 120A, of the two DLL circuit blocks in the dual DLL circuit module 111. For example, the second clock signal may be generated in the memory controller 110A according to a clock frequency change request. A first clock signal is supplied to one currently in use of the two DLL circuit blocks. For example, the first clock signal may be defined as a clock signal currently in use, and the second clock signal may be defined as a clock signal to be used next.

The two DLL circuit blocks in the dual DLL circuit module 111 may perform an operation of adjusting the phase of a clock signal that is used to fetch an address signal, a control signal, and a data signal, so as to compensate for the amount of delay occurring in an internal circuit of the memory system 100A.

Then, after the DLL circuit block to which the second clock signal is supplied reaches a lock state, the dual DLL circuit module 111 changes a signal path so as to connect a signal path connected to the DLL circuit block, to which a first clock signal is supplied in the dual DLL circuit module 111, to the DLL circuit block to which a clock signal to be used next is supplied, during a period where no information is transmitted between the memory controller 110A and the memory device 120A. For example, a period where there is no information transmission between the memory controller 110A and the memory device 120A may include an auto refresh operation period of the memory device 120A. Then, a signal path that the dual DLL circuit module 111 changes may include at least one path among a data signal path and a control signal path.

The memory device 120A may include a memory cell array 121. The memory cell array 121 may include a plurality of memory cells in the areas where a plurality of word lines and a plurality of bit lines intersect each other. For example, each of the plurality of memory cells may be implemented using a volatile memory cell, such as DRAM or SDRAM. Additionally, each of the plurality of memory cells may be implemented using a nonvolatile memory cell. The nonvolatile memory cell may be implemented using an Electrically Erasable Programmable Read-Only Memory (EEPROM) cell, a flash memory cell, or a resistive memory cell, such as a resistive RAM (RRAM) cell, a phase change RAM (PRAM) cell, or a magnetic RAM (MRAM) cell.

Additionally, the memory device 120A may be configured with a combination of at least one nonvolatile memory device and at least one volatile memory device, or with a combination of at least two kinds of nonvolatile memory devices.

The system bus 130A means an electrical path used for exchanging signals between the memory controller 110A and the memory device 120A. For example, signals transmitted via the system bus 130A may include data clock signals, address signals, and control signals. For example, address and control signals may be transmitted simultaneously via one electrical signal path.

Figure 2:
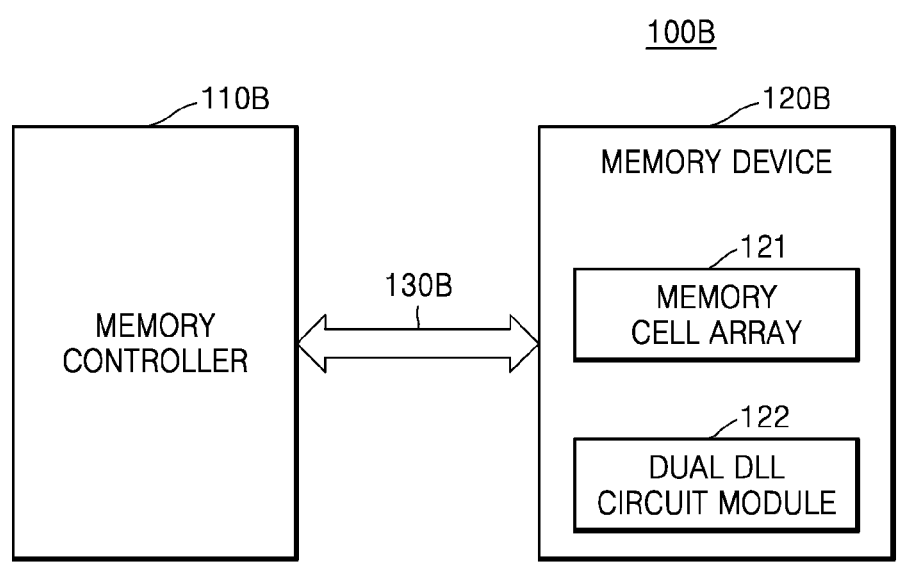
FIG. 2 is a block diagram illustrating a memory system according to another example embodiment.

FIG. 2 is a block diagram illustrating a memory system 100B according to another example embodiment.

As shown in FIG. 2, the memory system 100B includes a memory controller 110B, a memory device 120B, and a system bus 130B.

The memory controller 110B generates various signals to control the memory device 120B. For example, the memory controller 110B generates a clock signal, an address signal, and a control signal.

For example, a command may be generated by combining the logical values of the control signals generated from the memory controller 110B. As shown in FIG. 2, when the dual DLL circuit module 122 is included in the memory device 120B, it may define a DLL lock processing request on a clock signal to be used next in the dual DLL circuit module 122, as a new command. Control signals corresponding to a new command defined in such a manner may be generated by the memory controller 110B and then, transmitted to the memory device 120B via the system bus 130B.

Moreover, the memory controller 110B provides data signals to the memory device 120B or receives data signals from the memory device 120B in communication with the memory device 120B.

Also, the memory controller 110B may generate signals necessary for controlling operations of the memory device 120B at the timings shown in FIGS. 11(a) to 11(g).

Although the memory controller 110A of FIG. 1 includes the dual DLL circuit module 111, the memory controller 110B of FIG. 2 does not include the dual DLL circuit module 111.

Accordingly, the memory controller 110B performs a fetch operation on an address signal and a control signal on the basis of a clock signal having no phase adjusted, and transmits the fetched address and control signals to the memory device 120B. Additionally, the memory controller 110B performs a data signal fetch operation on the basis of an external clock signal having no phase adjusted, so as to transmit data to the memory device 120B or receive data from the memory device 120B.

The memory device 120B may include a memory cell array 121 and the dual DLL circuit module 122. For example, the dual DLL circuit module 122 may be included in an analog PHY (i.e., a physical layer) of the memory device 120B. Since the memory cell array 121 is described already with reference to FIG. 1, its repeated description is omitted.

The dual DLL circuit module 122 supplies a second clock signal to one not currently in use of the two DLL circuit blocks in the dual DLL circuit module 122 so as to adjust the phase of a clock signal to be used next. That is, the second clock signal may be supplied to a DLL circuit block in a standby state, which is not connected to a signal path for information transmission between the memory controller 110B and the memory device 120B, of the two DLL circuit blocks in the dual DLL circuit module 122.

For example, the second clock signal is generated by the memory controller 110B according to a clock frequency change request and then, transmitted to the memory device 120B via the system bus 130B. A first clock signal is supplied to one currently in use of the two DLL circuit blocks. Therefore, the first clock signal may be defined as a clock signal currently in use, and the second clock signal may be defined as a clock signal to be used next.

Accordingly, the system bus 130B includes two clock signal paths. That is, the system bus 130B includes a path for the first clock signal currently in use and a path for the second clock signal to be used next.

The two DLL circuit blocks in the dual DLL circuit module 122 may serve to adjust the phase of a clock signal inputted to the memory device 120B so as to compensate for the phase delay of a clock signal occurring in an internal circuit of the memory system 100B.

Then, after the DLL circuit block to which the second clock signal is supplied reaches a lock state, the dual DLL circuit module 122 changes a signal path so as to connect a signal path connected to the DLL circuit block, to which the first clock signal is supplied from the dual DLL circuit module 122, to the DLL circuit block to which the second signal is supplied, during a period where no information is transmitted between the memory controller 110B and the memory device 120B. For example, a period where there is no information transmission between the memory controller 110B and the memory device 120B may include an auto refresh operation period of the memory device 120B. Then, a signal path to which the dual DLL circuit module 122 changes may include at least one path among a data signal path and a control signal path.

The dual DLL circuit module 122 includes two DLL circuit blocks. The dual DLL circuit module 111 generates a phase-adjusted clock signal by using one DLL circuit block selected from among the two DLL circuit blocks and performs a fetch operation on an address signal and a control signal on the basis of the phase-adjusted clock signal so as to receive them from the memory controller 110B. Additionally, the dual DLL circuit module 122 performs a data signal fetch operation on the basis of the phase-adjusted clock signal, so as to transmit data to the memory controller 110B or receive data from the memory controller 110B.

The system bus 130B means an electrical path used for exchanging signals between the memory controller 110B and the memory device 120B. For example, signals transmitted via the system bus 130B may include data clock signals, address signals, and control signals. For example, address and control signals may be transmitted simultaneously via one electrical signal path.

Although the system bus 130A of FIG. 1 requires a signal path for transmitting a single clock signal, the system bus 130B of FIG. 2 requires signal paths for transmitting two clock signals.

Figure 3:
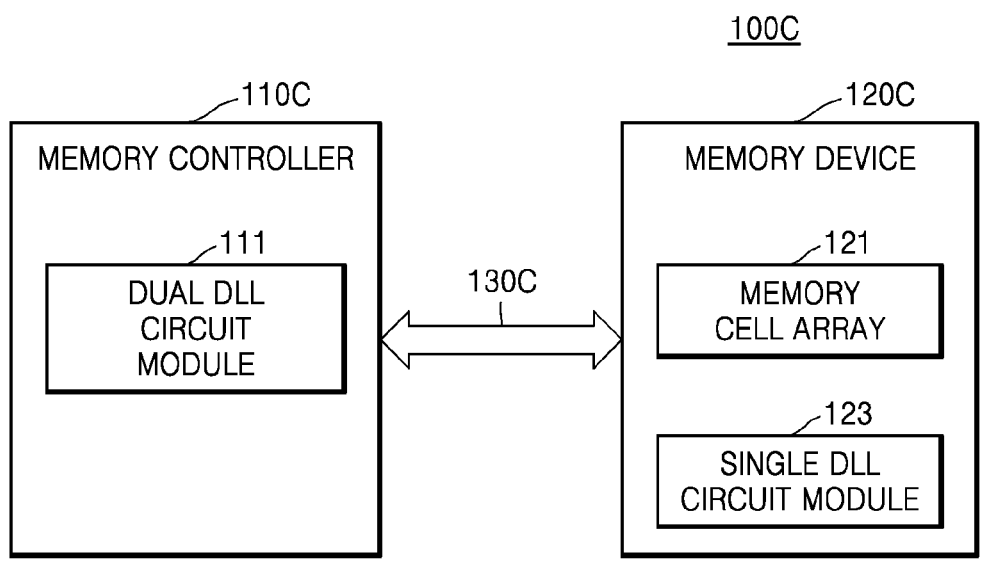
FIG. 3 is a block diagram illustrating a memory system according to another example embodiment.

FIG. 3 is a block diagram illustrating a memory system 100C according to another example embodiment.

As shown in FIG. 3, the memory system 100C includes a memory controller 110C, a memory device 120C, and a system bus 130C.

Referring to FIG. 3, in the memory system 100C, the memory controller 110C includes a dual DLL circuit module 111, and the memory device 120C includes a single DLL circuit module 123. For example, the dual DLL circuit module 111 may be included in an analog PHY (i.e., a physical layer) of the memory controller 110C, and the single DLL circuit module 123 may be included in an analog PHY (i.e., a physical layer) of the memory device 120C.

Since the memory controller 110C and the system bus 130C substantially have the same configurations and operations as the memory controller 110A and the system bus 130A of FIG. 1, respectively, their repeated descriptions are omitted. However, in comparison to the configuration of the memory system 100A, the memory system 100C of FIG. 3 is different in that the memory device 120C further includes the single DLL circuit module 123.

For reference, in the memory system 100C of FIG. 3, each of the dual DLL circuit module 111 and the single DLL circuit module 123 adjusts the phase of a clock signal so as to compensate for the amount of delay of a clock signal occurring in the memory controller 110C and the memory device 120C.

Additionally, since the memory cell array 121 in the memory device 120C is the same as the memory cell array 121 in the memory device 120C of FIG. 1, its repeated description is omitted.

The single DLL circuit module 123 is included in the memory device 120C. Also, the single DLL circuit module 123 adjusts the phase of a clock signal, so as to compensate for the amount of delay of a clock signal occurring in an internal circuit of the memory device 120C by one DLL circuit. Accordingly, one DLL circuit in the single DLL circuit module 123 generates a phase-adjusted clock signal and performs a fetch operation on an address signal and a control signal on the basis of the phase-adjusted clock signal so as to receive them from the memory controller 110C. Additionally, the single DLL circuit module 123 performs a data signal fetch operation on the basis of the phase-adjusted clock signal, so as to transmit data to the memory controller 110C or receive data from the memory controller 110C.

Figure 4:
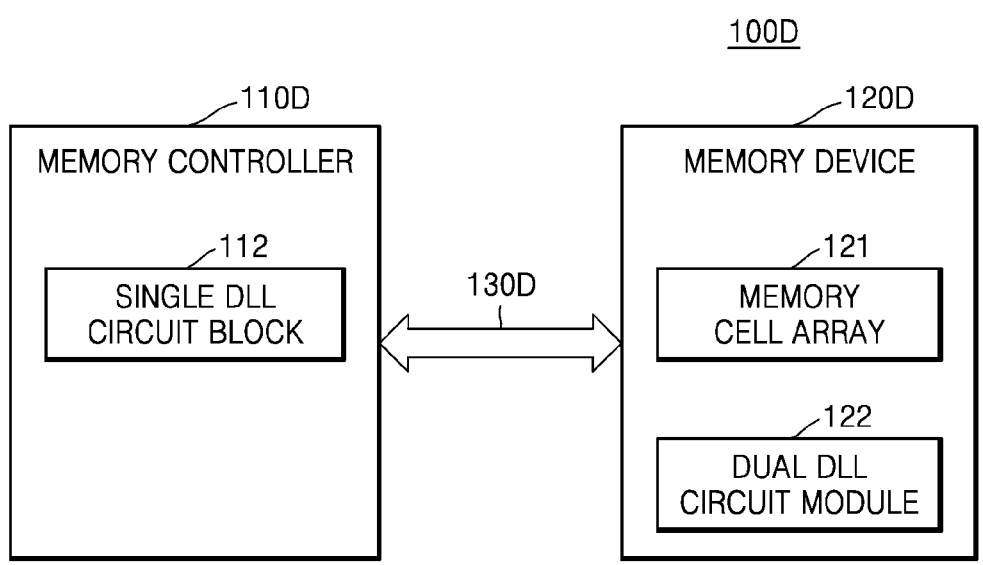
FIG. 4 is a block diagram illustrating a memory system according to another example embodiment.

FIG. 4 is a block diagram illustrating a memory system 100D according to another example embodiment.

As shown in FIG. 4, the memory system 100D includes a memory controller 110D, a memory device 120D, and a system bus 130D.

Referring to FIG. 4, in the memory system 100D, the memory controller 110D includes a single DLL circuit module 112, and the memory device 120D includes a dual DLL circuit module 122. For example, the single DLL circuit module 112 may be included in an analog PHY (i.e., a physical layer) of the memory controller 110D, and the dual DLL circuit module 122 may be included in an analog PHY (i.e., a physical layer) of the memory device 120D

Since the memory device 120D and the system bus 130D substantially have the same configurations and operations as the memory device 120B and the system bus 130B of FIG. 2, respectively, their repeated descriptions are omitted. However, in comparison to the configuration of the memory system 100B of FIG. 2, the memory system 100D of FIG. 4 is different in that the memory controller 110D further includes the single DLL circuit module 112.

For reference, in the memory system 100D of FIG. 4, each of the single DLL circuit module 112 and the dual DLL circuit block 122 adjusts the phase of a clock signal so as to compensate for the amount of delay of a clock signal occurring in the memory controller 110D and the memory device 120D.

Since the memory cell array 121 in the memory device 120D is the same as the memory cell array 121 in the memory device 120B of FIG. 2, its repeated description is omitted.

The single DLL circuit module 112 is included in the memory controller 110D. Also, the single DLL circuit module 112 adjusts the phase of a clock signal, so as to compensate for the amount of delay of a clock signal occurring in an internal circuit of the memory controller 110D by one DLL circuit. Accordingly, one DLL circuit in the single DLL circuit module 112 generates a phase-adjusted clock signal and performs a fetch operation on an address signal and a control signal on the basis of the phase-adjusted clock signal so as to transmit them to the memory device 120D. Additionally, the single DLL circuit module 112 performs a data signal fetch operation on the basis of the phase-adjusted clock signal, so as to transmit data to the memory device 120D or receive data from the memory device 120D.

Figure 5:
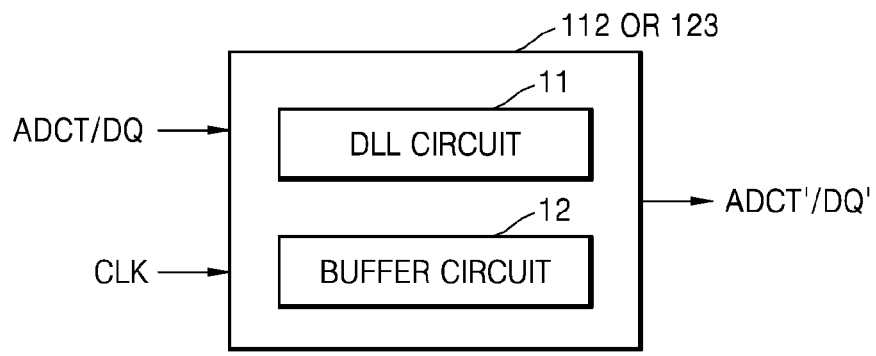
FIG. 5 is a view illustrating an example configuration of an integrated circuit for the single DLL circuit block of FIGS. 1 to 4.

FIG. 5 is a view illustrating a configuration of an integrated circuit for the single DLL circuit module 112 or 123 of FIG. 4 or 3.

As shown in FIG. 5, the single DLL circuit module 112 or 123 includes a DLL circuit 11 and a buffer circuit 12.

The DLL circuit 11 adjusts the phase of a clock signal so as to compensate for the amount of delay of a clock signal occurring in an internal circuit of a memory system, and outputs a phase-adjusted clock signal. For example, the DLL circuit 11 generates a phase-adjusted clock signal, so as to compensate for the amount of delay occurring while a clock signal CLK occurs in a memory system and is transmitted to the input/output terminal of an address/control signal ADCT or a data signal DQ.

The buffer circuit 12 latches and outputs a data signal DQ read from or written into the memory cell array 121 on the basis of a phase-adjusted clock signal generated from the DLL circuit 11. Accordingly, the buffer circuit 12 fetches the inputted data signal DQ in response to a phase-adjusted clock signal, and thus, outputs the phase-adjusted data signal DQ'.

Moreover, the buffer circuit 12 transmits the phase-adjusted clock signal to a memory device or latches and outputs an address/control signal ADCT read from or written into the memory cell array 121 on the basis of the phase-adjusted clock signal generated from the DLL circuit 11. Accordingly, the buffer circuit 12 fetches the inputted address/control signal ADCT in response to a phase-adjusted clock signal, thereby outputting the phase-adjusted address/control signal ADCT'.

Figure 6:
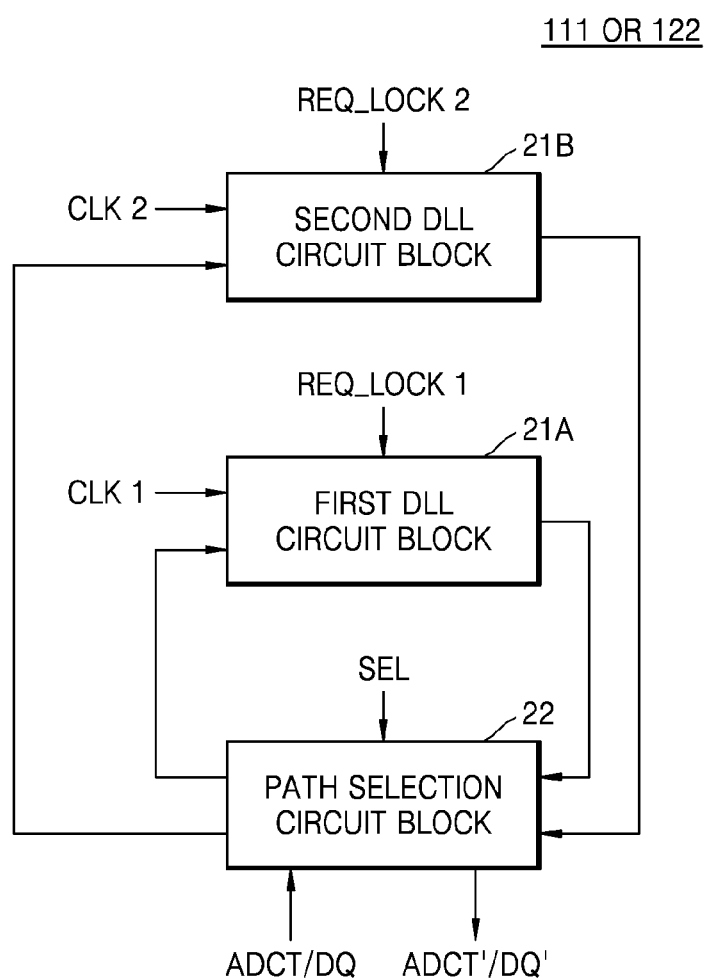
FIG. 6 is a view illustrating an example configuration of an integrated circuit for the dual DLL circuit module of FIGS. 1 to 4.

FIG. 6 is a view illustrating a configuration of an integrated circuit for the dual DLL circuit module 111 or 122 of FIG. 1 or 4.

As shown in FIG. 6, the dual DLL circuit module 111 or 122 includes a first DLL circuit block 21A, a second DLL circuit block 21B, and a path selection circuit block 22.

The first DLL circuit block 21A and the second DLL circuit block 21B may be configured substantially identical to the single DLL circuit module of FIG. 5. For reference, a first clock signal CLK1 applied to the first DLL circuit block 21A and a second clock signal CLK2 applied to the second DLL circuit block 21B are received through different signal paths.

The first DLL circuit block 21A adjusts the phase of the first clock signal CLK1 inputted to a first clock input terminal in response to a first DLL lock request signal REQ_LOCK1, and latches and outputs an address/control signal ADCT and a data signal DQ inputted from the path selection circuit block 22 on the basis of the phase-adjusted first clock signal, in response to a select signal SEL.

The second DLL circuit block 21B adjusts the phase of the second clock signal CLK2 inputted to a second clock input terminal in response to a second DLL lock request signal REQ_LOCK2, and latches and outputs an address/control signal ADCT and a data signal DQ inputted from the path selection circuit block 22 on the basis of the phase-adjusted second clock signal, in response to a select signal SEL.

For example, the first DLL lock request signal REQ_LOCK1 and the second DLL lock request signal REQ_LOCK2 may be generated from a memory controller. As another example, the first DLL lock request signal REQ_LOCK1 and the second DLL lock request signal REQ_LOCK2 may be generated from a memory device in response to a command generated from a memory controller.

The path selection circuit block 22 may connect a signal path for information transmission and reception to one of the first DLL circuit block 21A and the second DLL circuit block 21B, in response to a select signal SEL. The select signal SEL may occur during a period where no information is transmitted between a memory controller and a memory device. For example, the select signal SEL may occur in an auto refresh operation period of a memory device. For example, the select signal SEL may be generated from a memory controller. As another example, the select signal SEL may be generated from a memory device in response to a command generated from a memory controller.

The path selection circuit block 22 controls a signal path to allow input information ADCT/DQ to be applied to one of the first DLL circuit block 21A and the second DLL circuit block 21B, in response to a select signal SEL. Then, the path selection circuit block 22 controls a signal path to select and output information ADCT'/DQ' outputted from one of the first DLL circuit block 21A and the second DLL circuit block 21B, in response to a select signal SEL.

Figure 7:
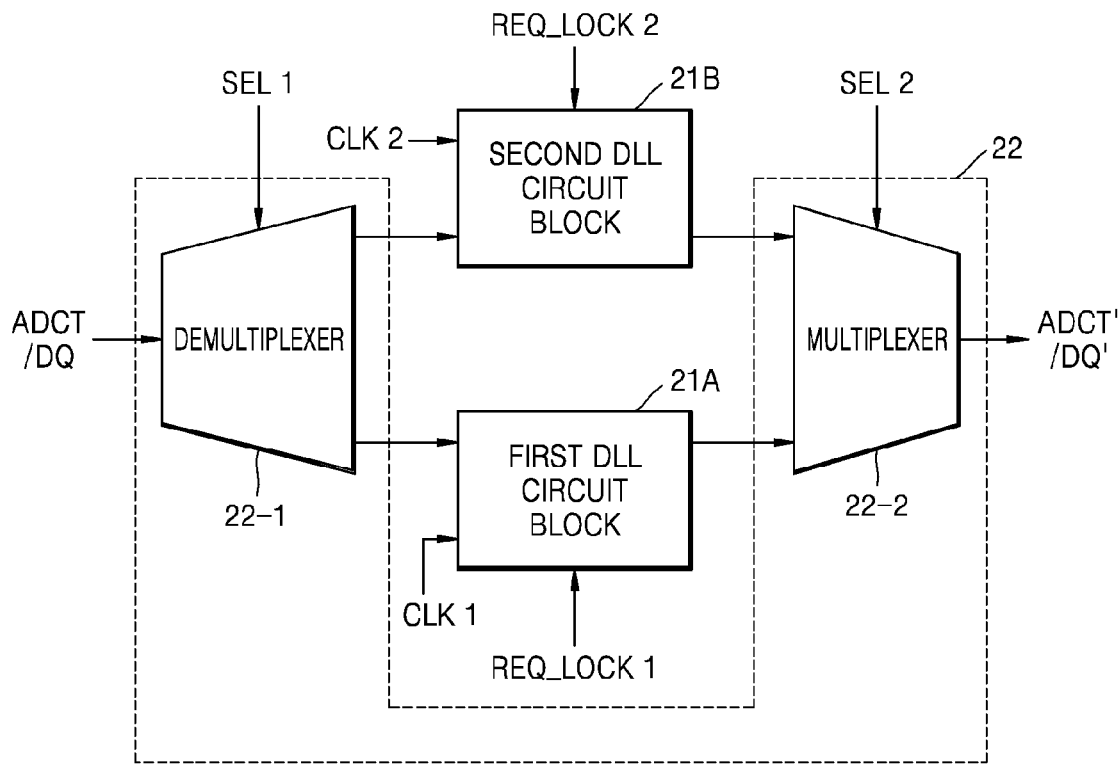
FIG. 7 is a view illustrating a more detailed example configuration of an integrated circuit for the dual DLL circuit module of FIG. 6.

FIG. 7 is a view illustrating a detailed configuration of an integrated circuit for the dual DLL circuit module 111 or 122 of FIG. 6.

As shown in FIG. 7, the dual DLL circuit module 111 or 122 includes a first DLL circuit block 21A, a second DLL circuit block 21B, and a path selection circuit block 22. Also, the path selection circuit block 22 includes a demultiplexer 22-1 and a multiplexer 22-2.

The demultiplexer 22-1 outputs an address signal, a control signal, and a data signal ADCT/DQ, i.e., information inputted to an input terminal, to one of the first DLL circuit block 21A and the second DLL circuit block 21B, in response to a first select signal SEL1.

The multiplexer 22-2 selects a phase-adjusted address signal, a control signal, and a data signal ADCT'/DQ', i.e., information inputted from one of the first DLL circuit block 21A and the second DLL circuit block 21B, in response to a second select signal SEL2, and then, outputs the selected signal through an output terminal.

For example, the first select signal SEL1 and the second select signal SEL2 may be designed as a common single select signal SEL. Since the first DLL circuit block 21A and the second DLL circuit block 21B are described with reference to FIG. 6, their repeated descriptions are omitted.

For example, it is assumed that in relation to a current operating state of a memory system, the first DLL circuit block 21A is selected according to a first logic value of the first select signal SEL1, and an address signal, a control signal, and a data signal ADCT/DQ inputted to the demultiplexer 22-1 are outputted to the first DLL circuit block 21A.

Then, the first DLL circuit block 21A compensates for the amount of delay of a first clock signal CLK1 to generate a phase-adjusted first clock signal in response to a first DLL lock request signal REQ_LOCK1, and latches an address signal, a control signal, and a data signal ADCT/DQ on the basis of the phase-adjusted first clock signal to output the phase-adjusted address signal, control signal, and data signal ADCT'/DQ'. Accordingly, a clock signal used in a current memory system becomes the first clock signal CLK1.

Then, according to a first logic value of the second select signal SEL2, the phase-adjusted address/control signal and data signal ADCT'/DQ' outputted from the first DLL circuit block 21A are selected and outputted through the output terminal of the multiplexer 22-2.

While a clock frequency change request occurs during such an operation, operations of the memory systems 100A to 100D will be described with reference to the timing diagrams of important signals of FIGS. 11(*a*) to (*g*).

The memory systems 100A to 100D generate a second clock signal CLK2 as a clock signal to be used next according to a clock frequency change request pulse REQ_CLK_CH.

The second clock signal CLK2 to be used next is applied to a second clock input terminal of the second DLL circuit block 21B, i.e., a DLL circuit block currently not in use, i.e. in an idle state.

Then, the memory systems 100A to 100D generate a second DLL lock request signal REQ_LOCK2 for starting a lock processing operation in the second DLL circuit block 21B to which the second clock signal CLK2 to be used next is applied. In response to the second DLL lock request signal REQ_LOCK2, an operation of adjusting the phase of the clock signal to be used next inputted to the second clock input terminal starts in the second DLL circuit block 21B. Until DLL lock processing is completed, the phase adjustment operation is performed.

After the second DLL circuit block 21B reaches a DLL lock state, the logic value of the select signal SEL changes from a first logic value to a second logic value during a period where no information is transmitted between a memory controller and a memory device. For example, when an auto refresh signal REF_AUTO occurs after the second DLL circuit block 21B reaches the DLL lock state, the logic value of a common select signal SEL changes from the first logic value to the second logic value during a period where an auto refresh operation is performed. The select signal SEL is a signal for controlling the signal paths of the demultiplexer 22-1 and the multiplexer 22-2 simultaneously. For example, the logic value of the select signal may change from the first logic value to the second logic value in response to the first clock signal CLK1 during a period where an auto refresh operation is performed.

Figure 11:
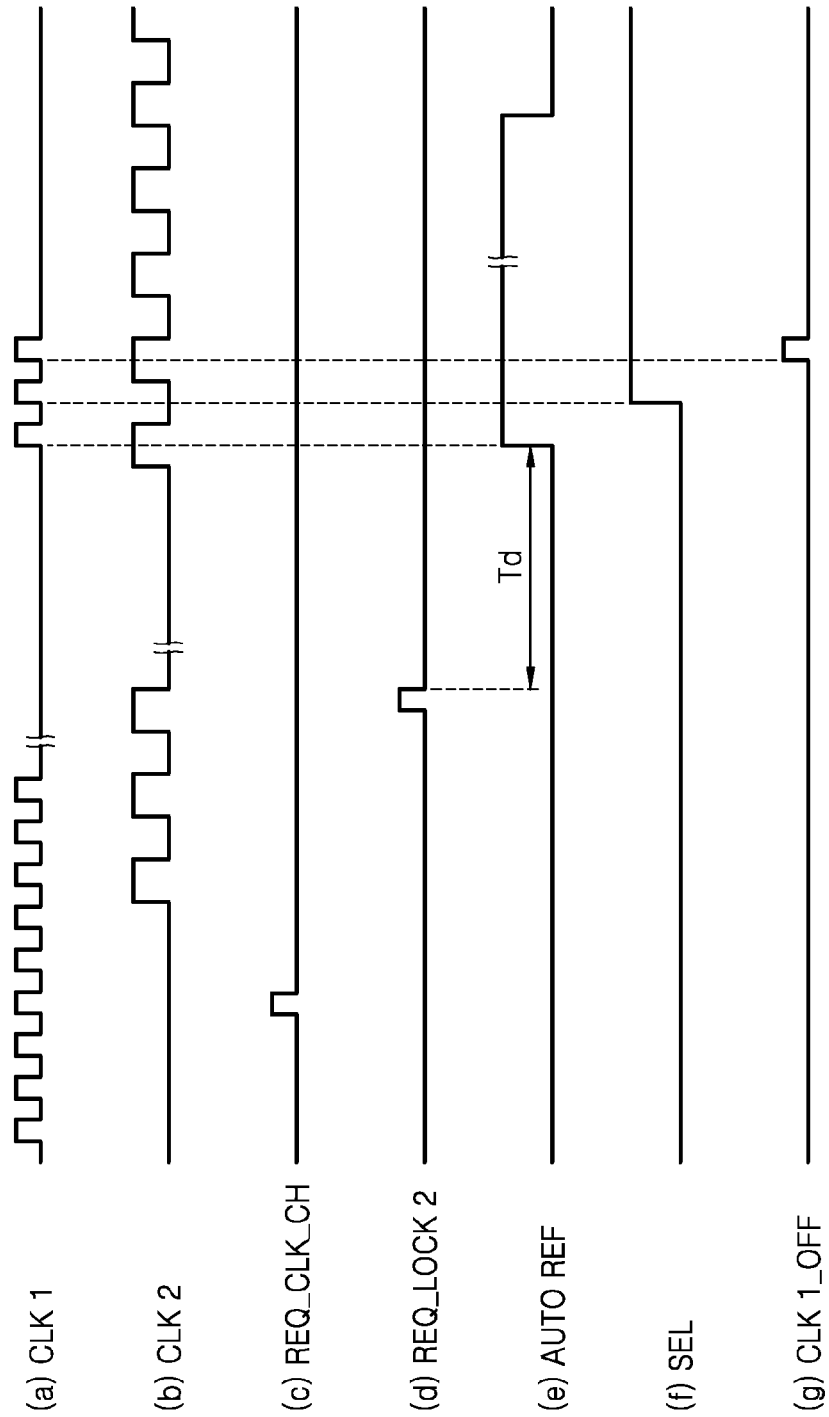
FIGS. 11(a) to (g) are example timing diagrams of main signals occurring in a memory system according to an example embodiment.

Referring to FIG. 11, when a time Td from the occurrence timing of the second DLL lock request signal REQ_LOCK2 to the occurrence timing of the auto refresh signal REF_AUTO is greater than a time necessary to reach the DLL lock state of the second DLL circuit block 21B, the logic value of the select signal SEL changes from the first logic value to the second logic value in an auto refresh operation period. When a time Td from the occurrence timing of the second DLL lock request signal REQ_LOCK2 to the occurrence timing of the auto refresh signal REF_AUTO is less than a time necessary to reach the DLL lock state of the second DLL circuit block 21B, the logic value of the select signal SEL changes from the first logic value to the second logic value during a period where the next auto refresh signal REF_AUTO occurs.

According to a logic value change of the select signal SEL, the demultiplexer 22-1 changes a signal path so as to apply an address/control signal and a data signal ADCT/DQ, i.e. input information, to the input terminal of the second DLL circuit block 21B.

Accordingly, the second DLL circuit block 21B latches the address/control signal and the data signal ADCT/DQ on the basis of the phase-adjusted second clock signal, and outputs the phase-adjusted address/control signal and data signal ADCT'/DQ'.

Moreover, according to a logic value change of the select signal SEL, the multiplexer 22-2 changes a signal path so as to select the phase-adjusted address/control signal and data signal ADCT'/DQ' outputted from the second DLL circuit block 21B.

Accordingly, a clock signal used in a memory system changes from the first clock signal CLK1 to the second clock signal CLK2. After the logic value of the select signal SEL changes from the first logic value into the second logic value, a signal CLK1 OFF for stopping the occurrence of the previously-used first clock signal CLK1 is generated. Therefore, the occurrence of the previously-used first clock signal CLK1 stops.

Figure 8:
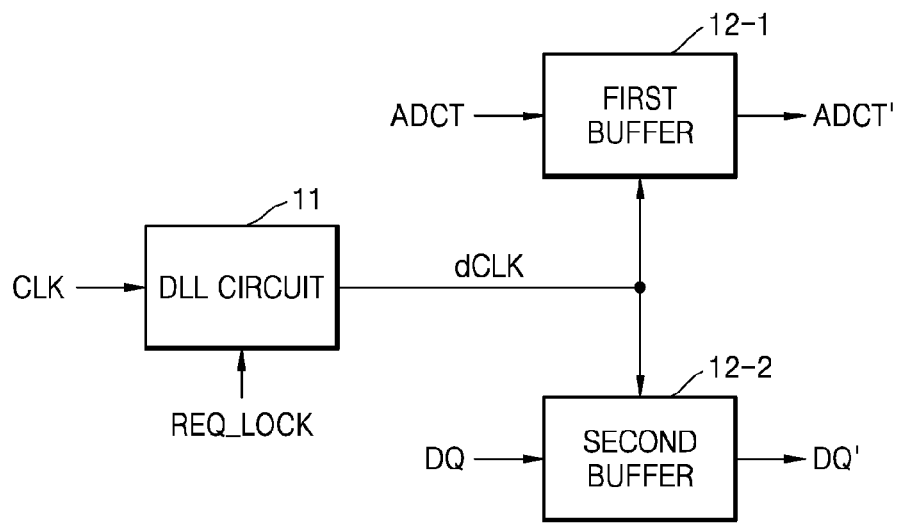
FIG. 8 is a view illustrating a more detailed example configuration of an integrated circuit for the single DLL circuit module of FIG. 5.

FIG. 8 is a view illustrating a detailed configuration of an integrated circuit for the single DLL circuit module 112 or 123 of FIG. 5. For reference, the first DLL circuit block 21A and the second DLL circuit block 21B of FIG. 7 may be configured substantially identical to the single DLL circuit module of FIG. 8.

As shown in FIG. 8, the single DLL circuit module 112 or 123 includes a DLL circuit 11, a first buffer 12-1, and a second buffer 12-2.

The DLL circuit 11 inputs a clock signal CLK, starts an operation of adjusting the phase of the clock signal CLK so as to compensate for the amount of delay of the clock signal CLK occurring in an internal circuit of a memory system in response to the DLL lock request signal REQ_LOCK, and outputs a phase-adjusted clock signal dCLK.

The phase-adjusted clock signal dCLK in the DLL circuit 11 is inputted to each of the first buffer 12-1 and the second buffer 12-2.

The first buffer 12-1 latches the address/control signal ADCT inputted to an information input terminal on the basis of the phase-adjusted clock signal dCLK, and then, outputs the phase-adjusted address/control signal ADCT'.

The second buffer 12-2 latches the data signal DQ inputted to an information input terminal on the basis of the phase-adjusted clock signal dCLK, and then, outputs the phase-adjusted data signal DQ'.

For example, each of the first buffer 12-1 and the second buffer 12-2 may be implemented using a flip-flop circuit. In more detail, it may be implemented using a D flip-flop circuit.

Figure 9:
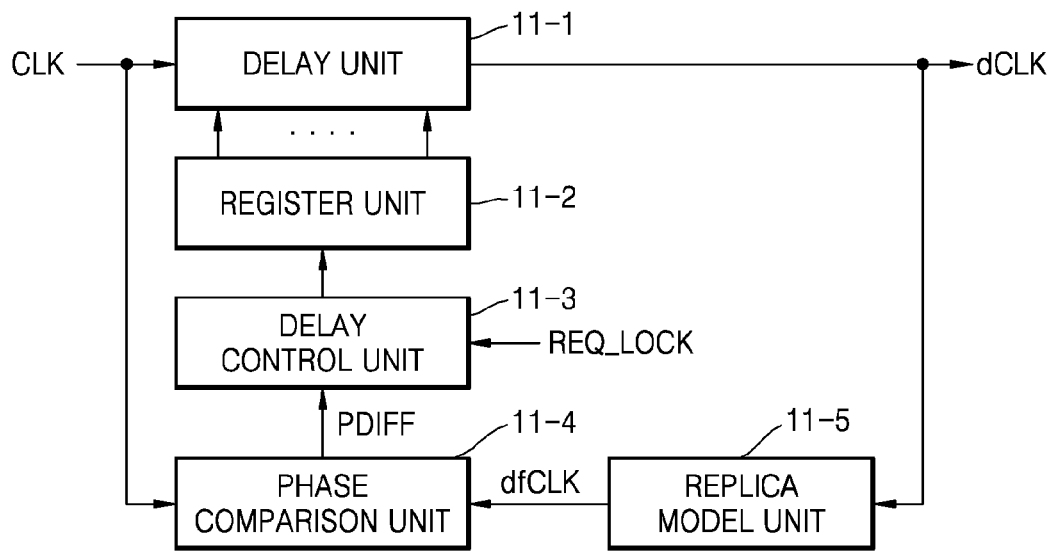
FIG. 9 is a view illustrating a more detailed example configuration of a DLL circuit of FIG. 8.

FIG. 9 is a view illustrating a detailed configuration of the DLL circuit 11 of FIG. 8.

As shown in FIG. 9, the DLL circuit 11 includes a delay unit 11-1, a register unit 11-2, a delay control unit 11-3, a phase comparison unit 11-4, and a replica model unit 11-5.

The delay unit 11-1 includes a plurality of delay cells and outputs a phase-adjusted clock signal dCLK in which an input clock signal CLK is delayed by a predetermined time. For example, a clock signal CLK inputted to the delay unit 11-1 may be an external clock signal. The amount of delay in the delay unit 11-1 is controlled by the delay control unit 11-3.

The amount of delay controlled by the delay control unit 11-3 is determined by a phase difference PDIFF between an input clock signal CLK and a delay clock signal dfCLK fed back through the replica model unit 11-5.

The replica model unit 11-5 is a circuit configured to have the same delay condition as an actual clock path through which the phase-adjusted clock signal dCLK is transmitted to an input/output terminal of a memory controller or an input/output terminal of a memory device.

The delay clock signal dfCLK fed back through the replica model unit 11-5 has the same phase as a clock signal transmitted to an input/output terminal of a memory controller or an input/output terminal of a memory device.

The phase comparison unit 11-4 compares the phases of an input clock signal CLK and a delay clock signal dfCLK fed back through the replica model unit 11-5, and then, outputs a phase difference PDIFF between the clock signal CLK and the delay clock signal dfCLK to the delay control unit 11-3.

The delay control unit 11-3 starts a lock processing operation in response to the DLL lock request signal REQ_LOCK. Once the lock processing operation starts, the delay control unit 11-3 generates a delay control signal for controlling the increase or reduction in the amount of delay of the delay unit 11-1 according to the phase difference PDIFF between the clock signal CLK and the delay clock signal dfCLK, and then, outputs the generated delay control signal to the register unit 11-2. For example, when the phase difference PDIFF between the clock signal CLK and the delay clock signal dfCLK is within an initially set range, the delay control unit 11-3 determines that a DLL circuit has reached a lock state.

The register unit 11-2 may include a plurality of shift registers, and may control the amount of delay of the delay unit 11-1 in response to a delay control signal inputted from the delay control unit 11-3.

Figure 10:
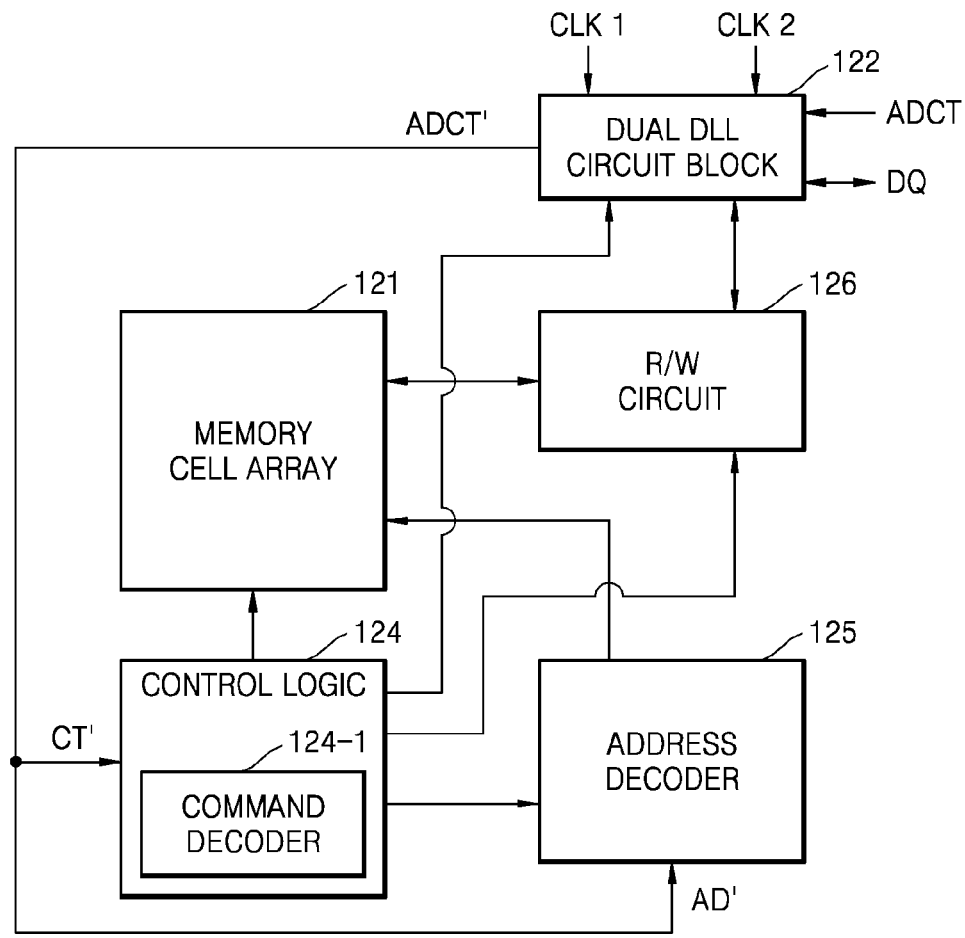
FIG. 10 is a view illustrating an example configuration of a memory device including a dual DLL circuit module, according to an example embodiment.

FIG. 10 is a view illustrating a configuration of the memory device 120B or 120D including the dual DLL circuit module 122 according to an example embodiment.

As shown in FIG. 10, the memory device 120B or 120D includes a memory cell array 121, a dual DLL circuit module 122, a control logic 124, an address decoder 125, and a read/write circuit 126.

The memory cell array 121 may include a plurality of memory cells in the areas where a plurality of word lines and a plurality of bit lines intersect each other. For example, each of the plurality of memory cells may be implemented using a volatile memory cell, such as DRAM or SDRAM. Additionally, each of the plurality of memory cells may be implemented using a nonvolatile memory cell The dual DLL circuit module 122 receives a first clock signal CLK1 or a second clock signal CLK2 from a memory controller via different signal paths.

As described with reference to FIGS. 6 to 9, the dual DLL circuit module 122 latches an address/control signal ADCT received from the memory controller on the basis of a phase-adjusted clock signal delaying one of the first clock signal CLK1 and the second clock signal CLK2, and then, outputs the phase-adjusted address/control signal ADCT'.

Also, the dual DLL circuit module 122 fetches data DQ received from a memory controller so as to provide the fetched data DQ to the read/write circuit 126 or fetches data DQ read from the read/write circuit 126 so as to transmit the read data DQ to the memory controller, on the basis of a phase-adjusted clock signal delaying one of the first clock signal CLK1 and the second clock signal CLK2.

A phase-adjusted address signal AD' outputted from the dual DLL circuit module 122 is provided to the address decoder 125, and a phase-adjusted control signal CT' outputted from the dual DLL circuit module 122 is provided to the control logic 124.

The control logic 124 includes a command decoder 124-1. The control logic 124 decodes input control signals CT' by using the command decoder 124-1, and then, generates a plurality of control and timing signals to control operations and timings of the memory cell array 121, the dual DLL circuit module 122, the address decoder 125, and the read/write circuit 126 according to the decoding processing result.

The address decoder 125 generates a signal to select a word line and a bit line of the memory cell array 121 by decoding the address signal AD' received through the dual DLL circuit module 122.

The read/write circuit 126 reads data from a memory cell connected to the word and bit lines selected by the address decoder 125, and then, outputs the read data to the dual DLL circuit module 122, or writes data signals provided from the dual DLL circuit module 122 to the word and bit lines selected by the address decoder 125.

Hereinafter, a method of processing dynamic frequency scaling for a clock frequency change in a memory system including a dual DLL circuit module will be described with reference to the flowcharts of FIGS. 12 to 14.

Figure 12:
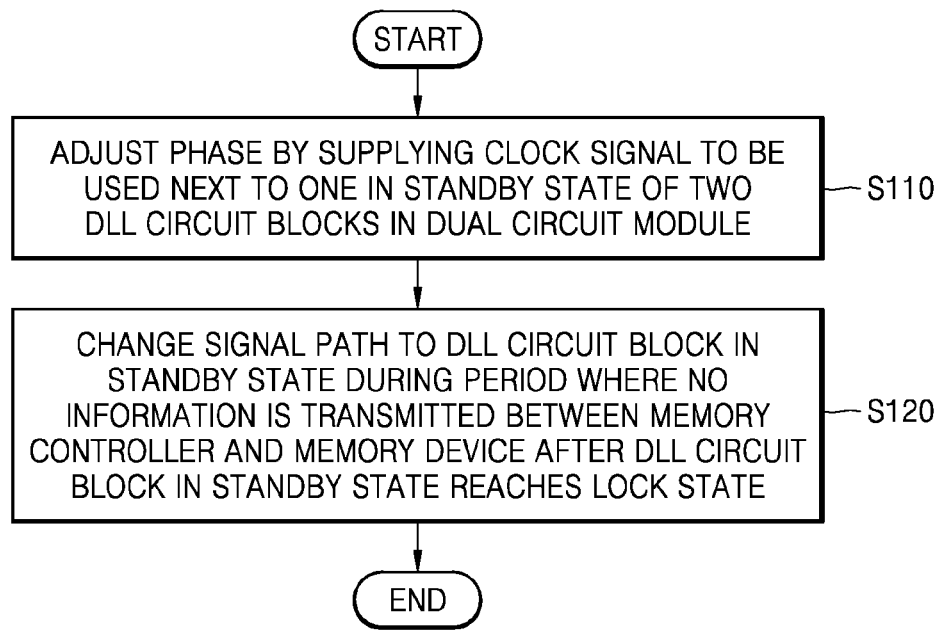
FIG. 12 is a flowchart illustrating a method of processing dynamic frequency scaling, according to an example embodiment.

FIG. 12 is a flowchart illustrating a method of processing dynamic frequency scaling, according to an example embodiment.

A memory system adjusts the phase of a second clock signal by supplying the second clock signal to one DLL circuit block in a standby state, which is not connected to a signal path for information transmission with a memory device, of two DLL circuit blocks in a dual DLL circuit module, according to a clock frequency change request, in operation S110. A first clock signal is supplied to one DLL circuit block connected to a signal path for information transmission with the memory device of two DLL circuit blocks in a dual DLL circuit module. Therefore, the first clock signal may be defined as a clock signal currently in use in a memory system, and the second clock signal may be defined as a clock signal to be used next in the memory system.

That is, one of the two DLL circuit blocks in a dual DLL circuit module adjusts the phase of a first clock signal used for signal processing in a current memory system. Also, besides one DLL circuit block adjusting the phase of a first clock signal currently in use of two DLL circuit blocks, a second clock signal is supplied to the other DLL circuit block in a standby state, so as to adjust the phase of the second clock signal.

Then, after the DLL circuit block in a standby state adjusting the phase of the second clock signal reaches a lock state, the memory system changes a signal path in order to connect a signal path, which is connected to a DLL circuit block to which the first clock signal is supplied in a dual DLL circuit module, to the DLL circuit block in a standby state, during a period where no information is transmitted between the memory controller and the memory device, in operation S120.

For example, after determination is made on whether the DLL circuit block in a standby state has reached a lock state, if the DLL circuit block is in the lock state, a signal path is changed from the DLL circuit currently in use to the DLL circuit block in a standby state. As another example, after the DLL circuit block in a standby state starts a lock processing operation and an initially set time elapses, the memory system changes a signal path from the DLL circuit currently in use to the DLL circuit block in a standby state. Here, the initially set time is determined to be greater than a minimum critical time necessary for a DLL circuit block to reach a lock state. After a signal path is changed to the DLL circuit block in a standby state, the occurrence of a previously-used clock signal is stopped.

For example, a period where there is no information transmission between the memory controller and the memory device may include an auto refresh operation period of the memory device. When a signal path connected to the DLL circuit block currently in use in the dual DLL circuit module is changed to connect to the DLL circuit block in a standby state according to an operation for changing a signal path, a clock frequency used in a memory system is changed into a frequency of a second clock signal. Accordingly, on the basis of a clock signal changed according to a frequency change request, an address signal, a control signal, and a data signal are transmitted or received.

Figure 13:
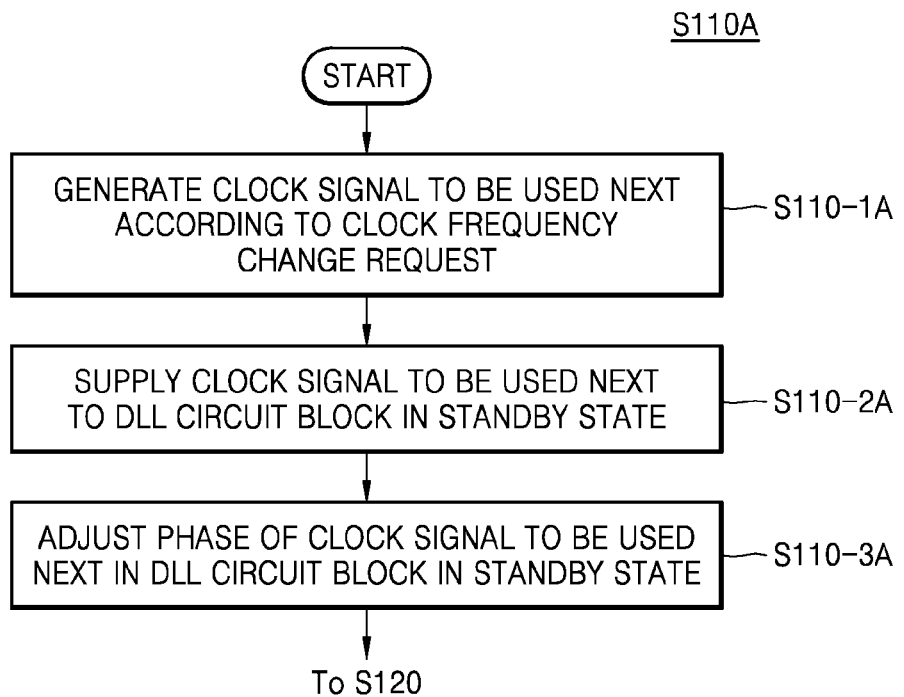
FIG. 13 is a flowchart illustrating an example embodiment of operation S110 of adjusting a phase in the DLL circuit block in a standby state of FIG. 12.

FIG. 13 is a flowchart illustrating operation S110 of adjusting a phase in the DLL circuit block in a standby state of FIG. 12, according to an example embodiment.

FIG. 13 illustrates a flowchart of operation S110 in which the DLL circuit block in a standby state adjusts a phase when a dual DLL circuit module is included in a memory controller of a memory system.

The memory system generates a clock signal to be used next according to a clock frequency change request, in operation S110-1A. For example, the clock frequency change request may be generated by the software or OS of the memory system in consideration of system performance such as the work process or power consumption of an application executed in the memory system.

The memory system supplies the second clock signal, which is generated according to the clock change request, to a clock input terminal of the DLL circuit block in a standby state of two DLL circuit blocks in a dual DLL circuit module, in operation S110-2A.

Then, the memory system operates to allow the DLL circuit block in a standby state to adjust the phase of a second clock signal, in operation S110-3A. For example, in response to a DLL lock request signal generated from the memory controller, the DLL circuit block in a standby state may start adjusting the phase of the second clock signal so as to compensate for the amount of delay of a clock signal occurring in an internal circuit of the memory system.

Figure 14:
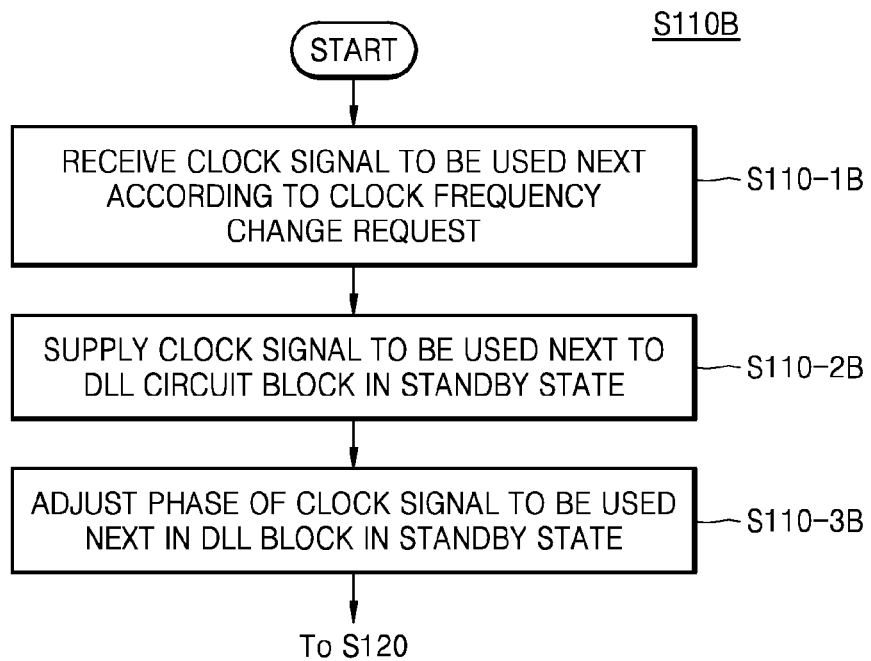
FIG. 14 is a flowchart illustrating another example embodiment of operation S110 of adjusting a phase in the DLL circuit block in a standby state of FIG. 12.

FIG. 14 is a flowchart illustrating operation S110 of adjusting a phase in the DLL circuit block in a standby state of FIG. 12, according to another example embodiment.

FIG. 14 illustrates a flowchart of operation S110 in which the DLL circuit block in a standby state adjusts a phase when a dual DLL circuit module is included in a memory device of a memory system.

The memory device receives a second clock signal having a frequency corresponding to a clock frequency change request, in operation S110-1B. The memory device simultaneously receives a first clock signal currently in use and a second clock signal to be used next from the memory controller via different clock signal paths. Accordingly, two clock signal paths are required between the memory device and the memory controller.

The memory system supplies the second clock signal to be used next to a clock input terminal of the DLL circuit block in a standby state of two DLL circuit blocks in a dual DLL circuit module, in operation S110-2B.

Then, the memory system operates to allow the DLL circuit block in a standby state to adjust the phase of the second clock signal, in operation S110-3B. For example, an operation of adjusting the phase of a clock signal to be used next in the DLL circuit block may be performed in response to the DLL lock request command received from the memory controller. For example, the DLL lock request command may be defined as a new command by using control signals generated from the memory controller.

Figure 15:
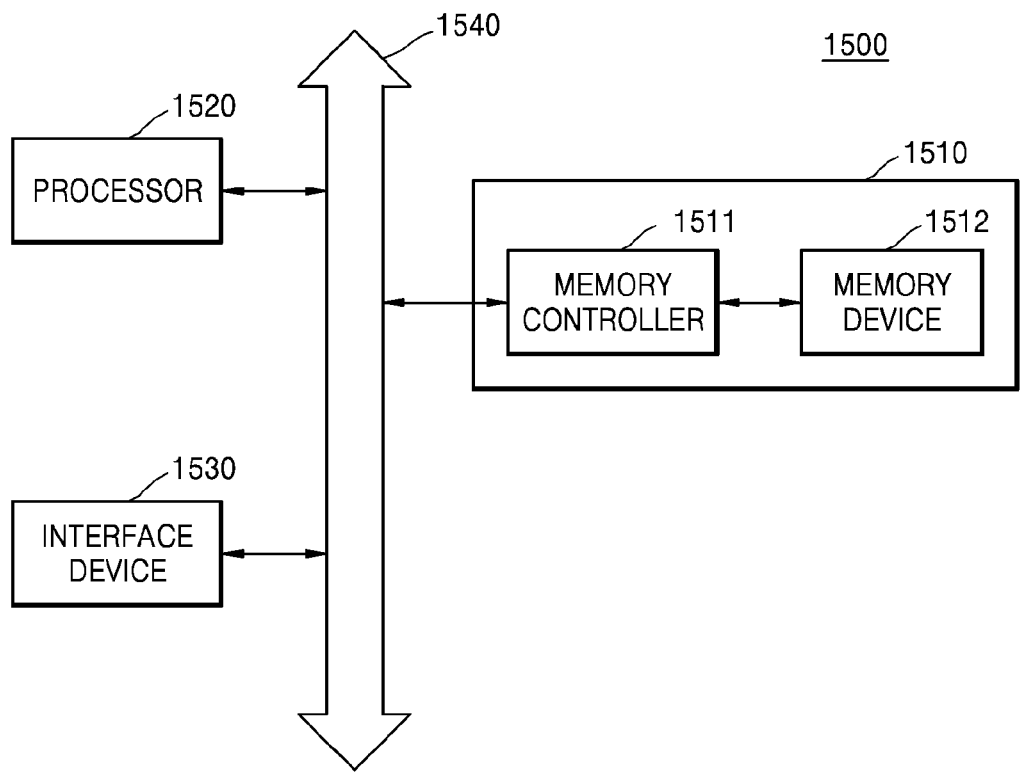
FIG. 15 is a view illustrating a configuration of a computer system attached to a memory system, according to various example embodiments.

FIG. 15 is a view illustrating a configuration of a computer system 1500 attached to a memory system according to various example embodiments.

Referring to FIG. 15, the computer system 1500 may be attached to a mobile device, a desktop computer, a notebook computer, a navigation system, a personal digital assistant (PDA), or a camera.

The computer system 1400 may include a memory system 1510, a processor 1520, and an interface device 1530, which are electrically connected to a system bus 1540.

The memory system 1510 may be implemented using one of the memory systems 100A to 100D of FIGS. 1 to 4.

The processor 1520 may perform specific calculations and tasks. For example, the processor 1520 generates information requesting the change of a clock frequency and provides it to the memory system 1510. According to an embodiment, the processor 1520 may be a micro-processor or a central processing unit (CPU). The processor 1520 may exchange information with the memory system 1510 and the interface device 1530 via the system bus 1540, such as an address bus, a control bus, or a data bus. According to an embodiment, the processor 1520 may be connected to an expansion bus, such as a peripheral component interconnect (PCI) bus.

The interface device 1530 may be an input device or an output device. For example, the interface device 1530 may include an input device, such as a keyboard, a mouse, or a scanner. For example, the interface device 1530 may include an output device, such as a printer.

Moreover, the interface device 1530 may include a wired communication device or a wireless communication device. Also, the interface device 1530 may include an image sensor.

The above-described memory system according to example embodiments may be mounted through various forms of packages. For example, the memory system may be mounted through packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While inventive concepts have been particularly shown and described with reference to exemplary embodiments thereof, it will be understood that various changes in form and details may be made therein without departing from the spirit and scope of the following claims.

What is claimed is:

1. An integrated circuit comprising:
    a first delay locked loop circuit configured to adjust a phase of a first clock signal input to a first clock input terminal, and to at least one of transmit and receive information based on the phase-adjusted first clock signal;
    a second delay locked loop circuit configured to adjust a phase of a second clock signal input to a second clock input terminal, and to at least one of transmit and receive information based on the phase-adjusted second clock signal; and
    a path selection circuit configured to select, in response to a select signal, one of a first signal path through the first delay locked loop circuit and a second signal path through the second delay locked loop circuit as a signal path for at least one of transmitting and receiving the information; wherein
        the select signal is generated during a period in which information is not transmitted between a memory controller and a memory device,
        the second delay locked loop circuit is in a standby state,
        the first clock signal is a clock signal currently in use by a memory system, and
        the second clock signal is a clock signal to be used by the memory system after the first clock signal.

2. The integrated circuit of claim 1, wherein the period during which information is not transmitted between the memory controller and the memory device includes an auto refresh operation period of the memory device.

3. The integrated circuit of claim 1, wherein the path selection circuit comprises:
    a demultiplexer configured to input the information to an information input terminal of the first delay locked loop circuit or an information input terminal of the second delay locked loop circuit in response to a first select signal; and
    a multiplexer configured to output the information from an information output terminal of the first delay locked loop circuit or an information output terminal of the second delay locked loop circuit in response to a second select signal.

4. The integrated circuit of claim 1, wherein the first delay locked loop circuit comprises:
    a delay locked loop circuit configured to adjust the phase of the first clock signal input to the first clock input terminal; and
    a buffer circuit configured to latch the information input to an information input terminal based on the phase-adjusted first clock signal, and to output the latched information to an information output terminal.

5. The integrated circuit of claim 1, further comprising:
a processor configured to generate a clock frequency change request; wherein
when the path selection circuit selects the first signal path, the second clock signal is applied to the second clock input terminal of the second delay locked loop circuit in response to the clock frequency change request.

6. The integrated circuit of claim 1, wherein the integrated circuit is a component of one of the memory controller and the memory device.

7. An integrated circuit comprising:
a first delay locked loop circuit configured to adjust a phase of a first clock signal, and output first information based on input information and the phase-adjusted first clock signal;
a second delay locked loop circuit configured to adjust a phase of a second clock signal while in a standby state, the second delay locked loop circuit being further configured to output second information based on the input information and the phase-adjusted second clock signal; and
a path selection circuit configured to switch from a first signal path to a second signal path for the input information in response to a select signal, the first signal path including the first delay locked loop, and the second signal path including the second delay locked loop, the path selection circuit including
a demultiplexer configured to input the input information to the first delay locked loop circuit or the second delay locked loop circuit based on a first select signal, and
a multiplexer configured to output the first information or the second information based on a second select signal.

8. The integrated circuit of claim 7, wherein the path selection circuit is configured to switch from the first signal path to the second signal path during a period where no information is transmitted between a memory controller and a memory device.

9. The integrated circuit of claim 8, wherein the period where no information is transmitted between the memory controller and the memory device includes an auto refresh operation period of the memory device.

10. The integrated circuit of claim 7, wherein the second delay locked loop circuit is configured to adjust the phase of the second clock signal prior to receiving the input information.

* * * * *